(12) United States Patent
Shih et al.

(10) Patent No.: US 6,523,255 B2
(45) Date of Patent: Feb. 25, 2003

(54) PROCESS AND STRUCTURE TO REPAIR DAMAGED PROBES MOUNTED ON A SPACE TRANSFORMER

(75) Inventors: Da-Yuan Shih, Poughkeepsie, NY (US); Keith Edward Fogel, Mohegan Lake, NY (US); Paul Alfred Lauro, Nanuet, NY (US); Brian Samuel Beaman, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/886,960

(22) Filed: Jun. 21, 2001

(65) Prior Publication Data

US 2002/0194730 A1 Dec. 26, 2002

(51) Int. Cl.[7] ................................................ H05K 3/00
(52) U.S. Cl. ........................... 29/843; 29/825; 29/842; 228/4.5; 228/179.1
(58) Field of Search .................... 29/843, 840, 825, 29/842, 844; 228/179.1, 4.5

(56) References Cited

U.S. PATENT DOCUMENTS

| 3,227,933 A | * | 1/1966 | Punte et al. |
| 3,373,481 A | * | 3/1968 | Lins et al. |
| 4,955,523 A | * | 9/1990 | Carlomagno et al. |
| 5,095,187 A | * | 3/1992 | Gliga |
| 5,176,310 A | * | 1/1993 | Akiyama et al. |
| 5,495,667 A | * | 3/1996 | Farnworth et al. |
| 6,213,382 B1 | * | 4/2001 | Akimoto |

FOREIGN PATENT DOCUMENTS

JP         360134444 A   *  7/1985

* cited by examiner

Primary Examiner—Carl J. Arbes
(74) Attorney, Agent, or Firm—Thomas A. Beck; Daniel P. Morris, Esq

(57) ABSTRACT

Method for repairing, reworking or replacing damaged probes that are formed using a flying lead wire bonding process used for testing integrated circuit devices and other electronic devices, with the same column and row spacing as the original probes and using the same height as the original probes.

15 Claims, 11 Drawing Sheets

PROCESS AND STRUCTURE TO REPAIR DAMAGED PROBES MOUNTED ON A SPACE TRANSFORMER

FIELD OF THE INVENTION

The present invention is directed to probe structures for testing of electrical interconnections to integrated circuit devices and other electronic components and particularly to testing of integrated circuit devices with rigid interconnection pads and multi-chip module packages with high density interconnection pads.

BACKGROUND OF THE INVENTION

Integrated circuit (IC) devices and other electronic components are normally tested to verify the electrical function of the device and certain devices require high temperature burn-in testing to accelerate early life failures of these devices. Wafer probing is typically done on a single chip site at temperatures ranging from 25° C.–125° C. while burn-in is typically done on diced and packaged chips at temperatures ranging from 80° C. to 150° C. Wafer probing and IC chip burn-in at elevated temperatures of up to 200° C. has several advantages and is becoming increasingly important in the semiconductor industry. Simultaneous testing of multiple chips on a single wafer has obvious advantages for reducing costs and increasing production throughput and is a logical step towards testing and burn-in of an entire wafer.

The various types of interconnection methods used to test these devices include permanent, semi-permanent, and temporary attachment techniques. The permanent and semi-permanent techniques that are typically used include soldering and wire bonding to provide a connection from the IC device to a substrate with fan out wiring or a metal lead frame package. The temporary attachment techniques include rigid and flexible probes that are used to connect the IC device to a substrate with fan out wiring or directly to the test equipment.

The permanent attachment techniques used for testing integrated circuit devices such as wire bonding to a lead frame of a plastic leaded chip carrier are typically used for devices that have low number of interconnections and the plastic leaded chip carrier package is relatively inexpensive. The device is tested through the wire bonds and leads of the plastic leaded chip carrier and plugged into a test socket. If the integrated circuit device is defective, the device and the plastic leaded chip carrier are discarded.

The semi-permanent attachment techniques used for testing integrated circuit devices such as solder ball attachment to a ceramic or plastic pin grid array package are typically used for devices that have high number of interconnections and the pin grid array package is relatively expensive. The device is tested through the solder balls and the internal fan out wiring and pins of the pin grid array package that is plugged into a test socket. If the integrated circuit device is defective, the device can be removed from the pin grid array package by heating the solder balls to their melting point. The processing cost of heating and removing the chip is offset by the cost saving of reusing the pin grid array package.

The most cost effective techniques for testing and burn-in of integrated circuit devices provide a direct interconnection between the pads on the device to a probe sockets that is directly connected to the test equipment. Contemporary probes for testing integrated circuits are expensive to fabricate and are easily damaged. The individual probes are typically attached to a ring shaped printed circuit board and support cantilevered metal wires extending towards the center of the opening in the circuit board. Each probe wire must be aligned to a contact location on the integrated circuit device to be tested. The probe wires are generally fragile and easily deformed or damaged. This type of probe fixture is typically used for testing integrated circuit devices that have contacts along the perimeter of the device. This type of probe is also much larger than the IC device that is being tested and the use of this type of probe for high temperature testing is limited by the probe structure and material set.

Another technique used for testing IC devices comprises a thin flex circuit with metal bumps and fan out wiring. The bumps are typically formed by photo lithographic processes and provide a raised contact for the probe assembly. The bumps are used to contact the flat or recessed aluminum bond pads on the IC device. An elastomer pad is typically used between the back of the flex circuit and a pressure plate or rigid circuit board to provide compliance for the probe interface. This type of probe is limited to flexible film substrate materials that typically have one or two wiring layers.

High density probes used for wafer probing are typically very expensive due to the complexity of the substrate or space transformer and the process used for attaching and aligning the probes to the substrate. During the useful life of a probe fixture, it is likely to be damaged due to handling or worn from normal use. In order to avoid the expense of replacing the entire test fixture (substrate and probe contacts), it is desirable to be able to repair, rework, or replace the damaged or worn probes without replacing the entire substrate.

PRIOR ART

The prior art described below includes a several different probe fixtures for testing bare IC chips.

Rework and repair techniques exist for cantilever probes that are used to test low density I/O circuit devices. The rework and repair techniques include manual reforming and repositioning the cantilever probes as well as removing and replacing individual cantilever probes attached to the test card. The rework and repair techniques are the same manual processes used to fabricate the original cantilever probe card.

Flex circuit test probe structures are also limited to testing low density I/O circuit devices and are relatively inexpensive. The flex probe interposer is usually discarded and replaced when they are worn out or become damaged.

Cobra probes are a type of compliant interposer probe that have been used to test IC devices in IBM for many years. Cobra probes have primarily been used to test IC devices with C4 solder ball connection but can be modified to test IC devices with wire bond pads. The Cobra probes are made from a Paleney 7 alloy and are housed in a machined Vespal housing. Cobra probes can be reworked and repaired as a separate operation since the probes are not attached to a test card or fanout substrate. The rework operations that are typical for a cobra probe assembly include refinishing the contact surface of the probes to remove contamination along with disassembling and replacing damaged probes.

SUMMARY OF THE INVENTION

It is the object of the present invention to provide a means of repairing, reworking, or replacing damaged probes that are formed using a "flying lead" wire bonding process and used for testing integrated circuit devices and other electronic components.

Another object of the present invention is to provide a means of repairing, reworking, or replacing damaged probes with the same column and row spacing as the original probes.

A further object of the present invention is to provide a means of repairing, reworking, or replacing damaged probes with the same wire geometry as the original probes.

An additional object of the present invention is to provide a means of repairing, reworking, or replacing damaged probes with the same probe height as the original probes.

BRIEF DESCRIPTION OF THE DRAWINGS

These and other objects, features, and advantages of the present invention will become apparent upon further consideration of the following detailed description of the invention when read in conjunction with the drawing figures, in which.

DETAILED DESCRIPTION OF THE INVENTION

Preferred Embodiment

Figure 1:
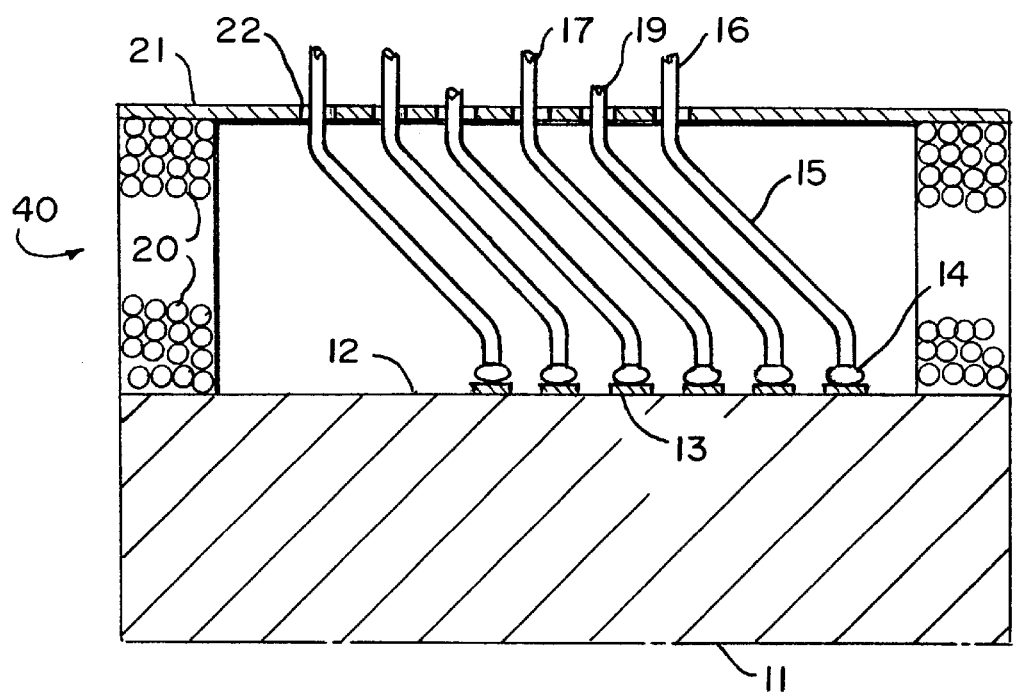
FIG. 1 shows a cross-section of an array of probes mounted on a substrate with a damaged tip on one of the probes.

FIG. 1 shows a cross section of an array of probes (10) mounted on a substrate (11) with a damaged tip (19) on one of the probes. The array of probes (10) is comprised of a plurality of curved wires (15), a surface layer alignment mask (21), and a rigid spacer (20). The plurality of curved wires (15) are attached to circuit traces (13) on a first surface (12) of the substrate (11) with ball bonds (14) formed with a modified thermosonic wire bonding process. The surface layer alignment mask (21) has a plurality of holes (22) corresponding with the plurality of curved wires (15). The ends (16) of the plurality of curved wires (15) protrude through the holes (22) in the surface layer alignment mask (21). The rigid spacer (20) surrounds the plurality of curved wires (15) and supports the surface layer alignment mask (21). The substrate (11) provides a means of fanning out the wiring from the contacts (13) on the first surface (12) to the equipment used to electrically test the integrated circuit device. The fan out substrate can be made from various materials and constructions including single and multi-layer ceramic with thick or thin film wiring, silicon wafer with thin film wiring, or epoxy glass laminate construction with high density copper wiring. The contacts (13) are usually flush with or slightly raised above the first surface (12) of the substrate (11). A damaged probe is shown in FIG. 1 with the tip of the probe (19) bent over. The damaged tip (19) prevents the probe from making contact the circuit pad on an integrated circuit device when the probe array (10) is used for testing.

Figure 2:
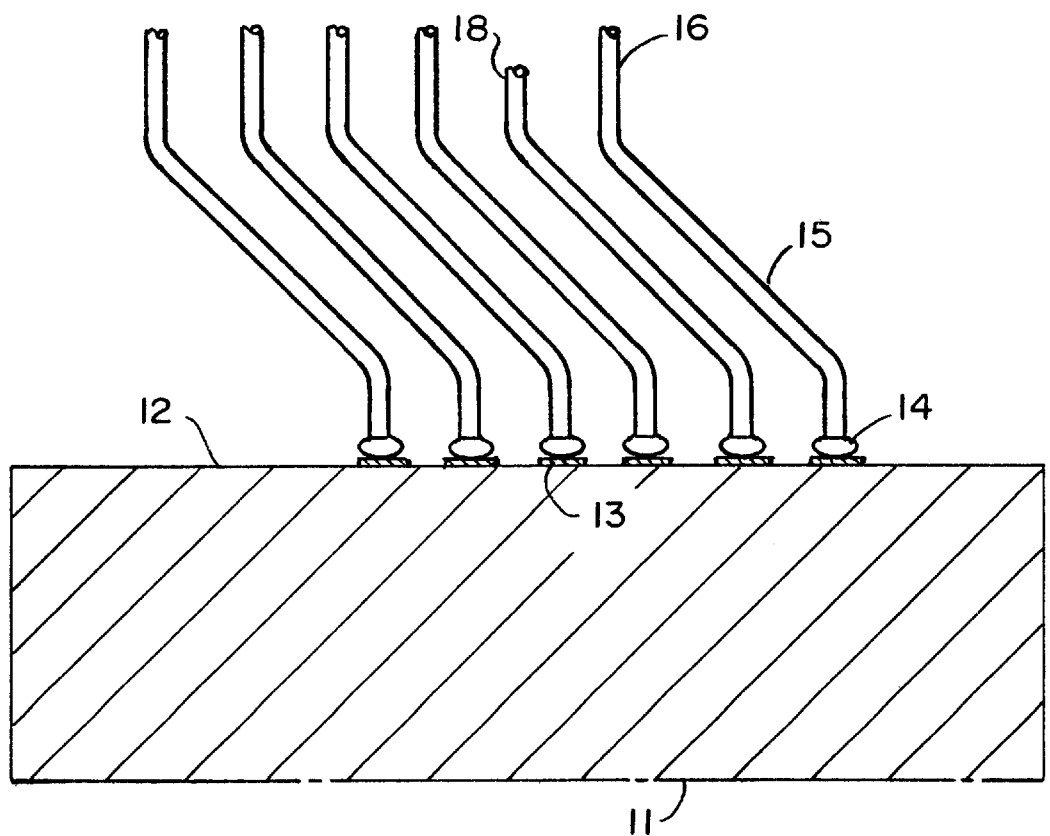
FIG. 2 shows a cross-section of the array of probes mounted on a substrate with the surface layer alignment mask and spacer removed.

FIG. 2 shows a cross section of the array of probes (10) mounted on a substrate (11) with the surface layer alignment mask (21) and rigid spacer (20) removed. In order to remove the surface layer alignment mask (21), the damaged tip (19) on the probe must be straightened or removed (18) with a pair of tweezers. The surface layer alignment mask (21) provides a means of controlling the true position of the ends (16) of the plurality of curved wires (15).

Figure 3:
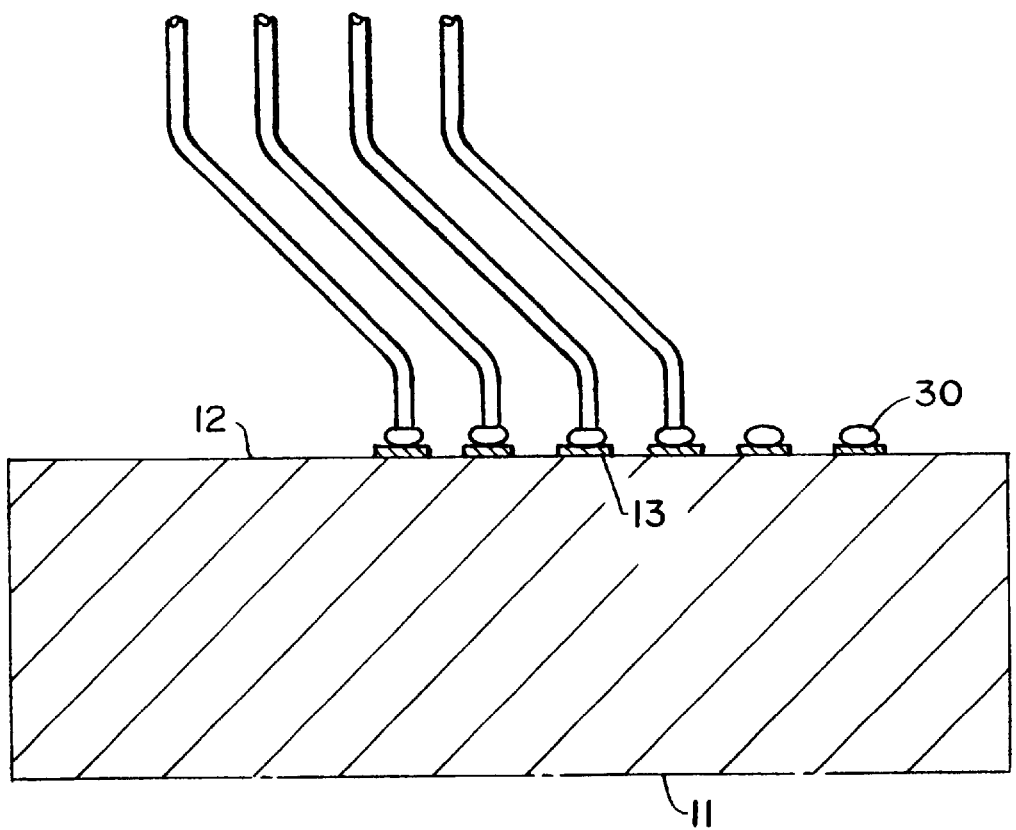
FIG. 3 shows a cross-section of an array of probes mounted on a substrate with the wires removed from two ball bonds.

FIG. 3 shows a cross section of an array of probes (10) mounted on a substrate (11) with the curved wires (15) removed from two ball bonds (30). Since the geometry of the curved wires (15) has the tip of the probe offset from the ball bond at the base of the wire, it is necessary to remove the adjacent probe or probes that overlap with the damaged probe. If the damaged probe is in the center of a large array of probes, all of the adjacent wires in the same row as the damaged probe will need to be removed in order to repair the damaged probe. The probe wires are typically removed by pulling on the wire until it fractures at the base of the wire, above the ball bond (30).

Figure 4:
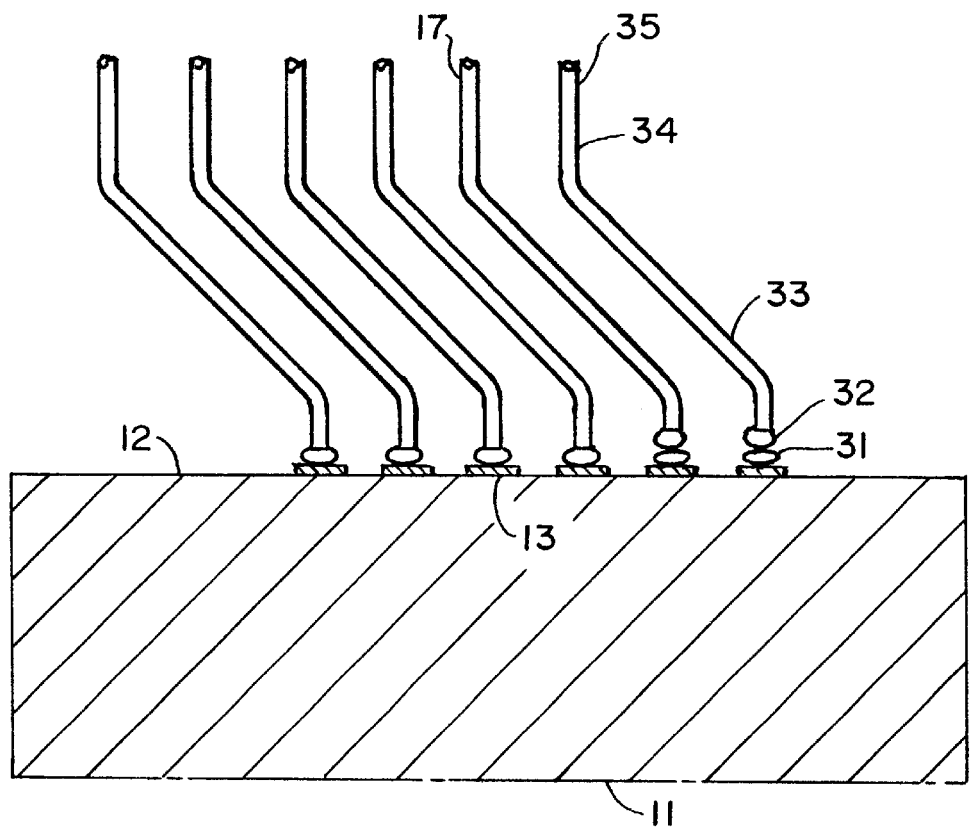
FIG. 4 shows a cross-section of an array of probes mounted on a substrate with two new wires bonded on top of the reworked ball bonds.

FIG. 4 shows a cross section of an array of probes mounted on a substrate (11) with two new wires (33) bonded on top of the reworked ball bonds (31). The new wire (33) is attached to the reworked ball bond (31) by the same "flying lead" ball bonding process used to attach the original set of curved wires (15) to the substrate (11). The ball bond (32) of the new wire (33) is attached to the top of the reworked ball bond (31) and the curved wire geometry is formed identical to the original set of curved wires (15). The height of the tip (35) is the same as the height of the tip (17) of the original curved wires (15) and the spacing from wire to wire is the same for all of the curved wires (15, 33).

Figure 5:
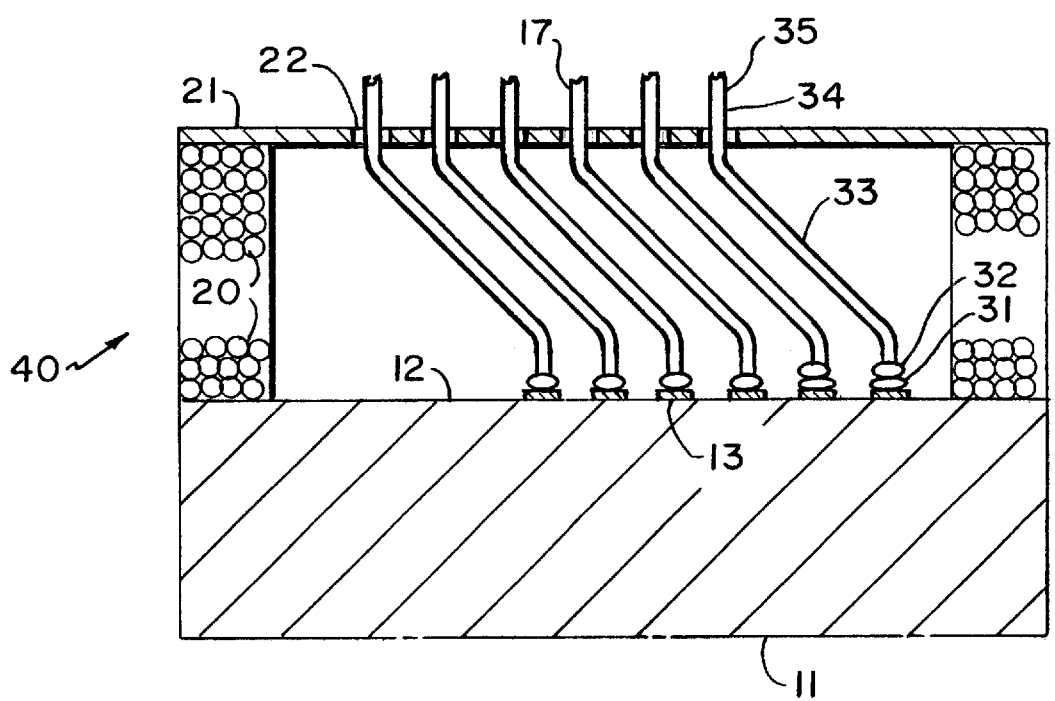
FIG. 5 shows a cross-section of an array of probes mounted on a substrate with the surface layer alignment mask and spacer replaced over the ends of the probes.

FIG. 5 shows a cross section of an array of probes mounted on a substrate (11) with the surface layer alignment mask (21) and spacer (20) replaced over the ends (17, 35) of the probes. The surface layer alignment mask (21) and spacer (20) are placed over the reworked array of curved wires (15, 31) using the same technique used on the original set of probes. The plurality of holes (22) in the surface layer alignment mask (21) are aligned with the plurality of curved wires (15, 31) and gently lowered to rest on the spacer (20). Once the surface layer alignment mask (21) is in place an aligned, it is securely attached to the spacer (20) and the substrate (11) and the rework process is completed.

An Alternate Preferred Embodiment

Figure 6:
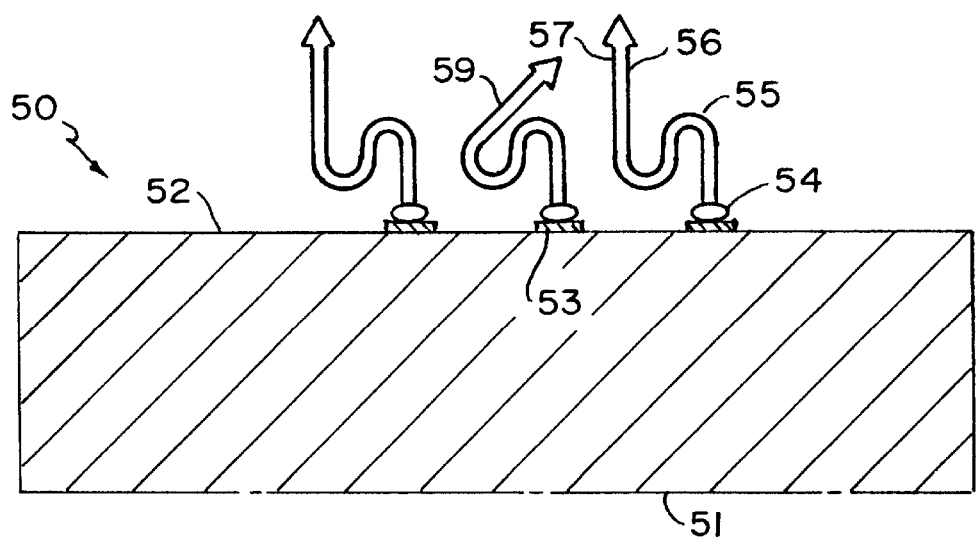
FIG. 6 shows a cross-section of an alternate embodiment of an array of probes mounted on a substrate with a damaged probe.

FIG. 6 shows a cross section of an alternate embodiment of an array of probes (50) mounted on a substrate (51) with a damaged probe wire (59). The array of probes (50) is comprised of a plurality of curved wires (55) with hardened tips (57) attached to the ends of the curved wires (55). The plurality of curved wires (55) are attached to circuit traces (53) on a first surface (52) of the substrate (51) with ball bonds (54) formed with a modified thermosonic wire bonding process. The plurality of probe wires (55) are formed with a curved section in between the ball bond (54) and the straight end (56) to provide a compliant, elastic structure. The substrate (51) provides a means of fanning out the wiring from the contacts (53) on the first surface (52) to the equipment used to electrically test the integrated circuit device. The damaged to the probe (59) shown in FIG. 6 prevents the probe from making contact the circuit pad on an integrated circuit device when the probe array (50) is used for testing.

Figure 7:
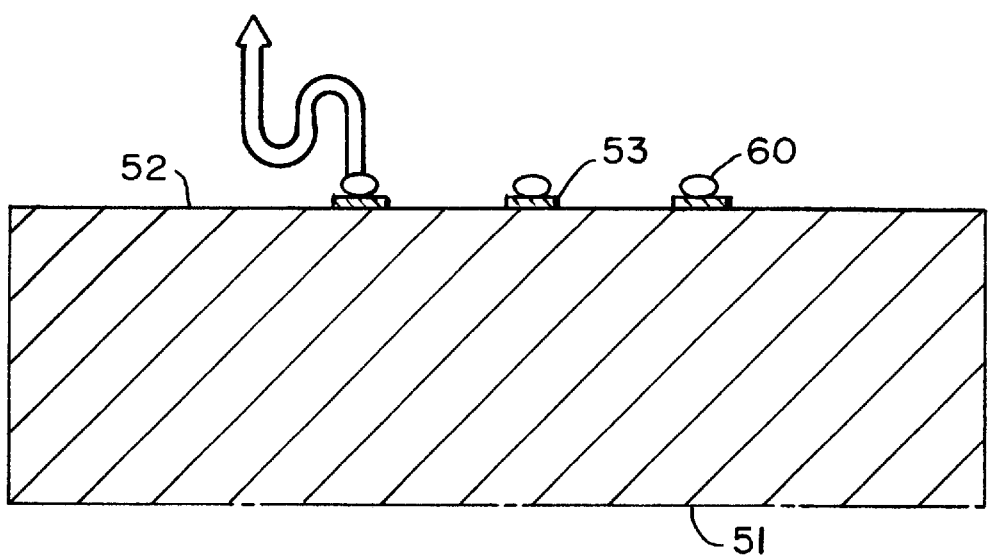
FIG. 7 shows a cross-section of an alternate embodiment of an array of probes mounted on a substrate with the wires removed from two ball bonds.

FIG. 7 shows a cross section of an alternate embodiment of an array of probes (50) mounted on a substrate (51) with the curved wires (55) removed from two ball bonds (60). Due to the close spacing of the curved wires (55), it is necessary to remove the adjacent probe or probes in order to provide room for the wire bonding tool to bond new probe wires. The damaged probe wire (59) is typically removed by pulling on the wire until it fractures at the base of the wire, above the ball bond (60).

Figure 8:
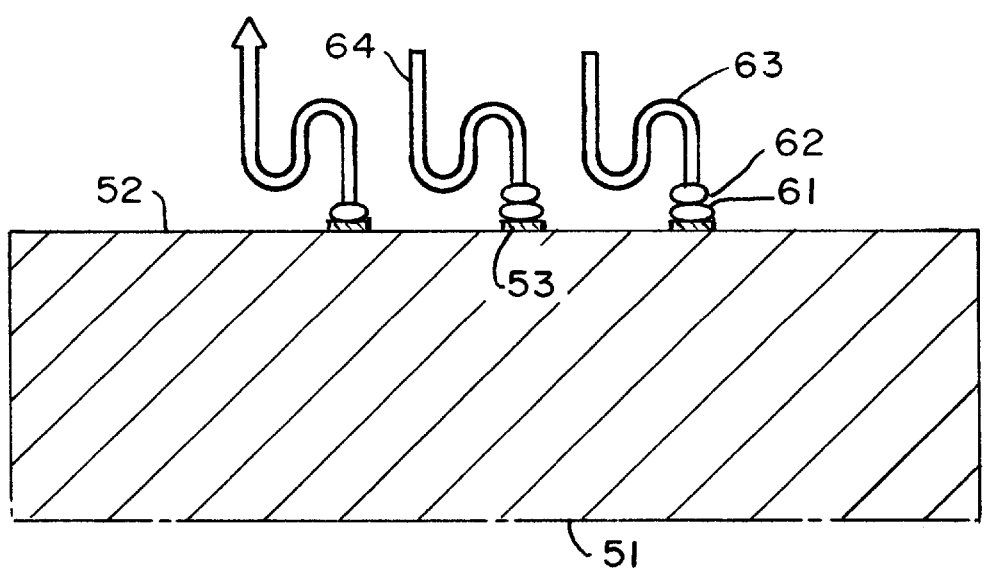
FIG. 8 shows a cross-section of an alternate embodiment of an array of probes mounted on a substrate with two new wires bonded on top of the reworked ball bonds.

FIG. 8 shows a cross section of an alternate embodiment of an array of probes (50) mounted on a substrate (51) with two new wires (63) bonded on top of the reworked ball bonds (61). The new wire (63) is attached to the reworked ball bond (61) by the same "flying lead" ball bonding process used to attach the original set of curved wires (55) to the substrate (51). The ball bond (62) of the new wire (63) is attached to the top of the reworked ball bond (61) and the curved wire geometry is formed identical to the original set of curved wires (55).

Figure 9:
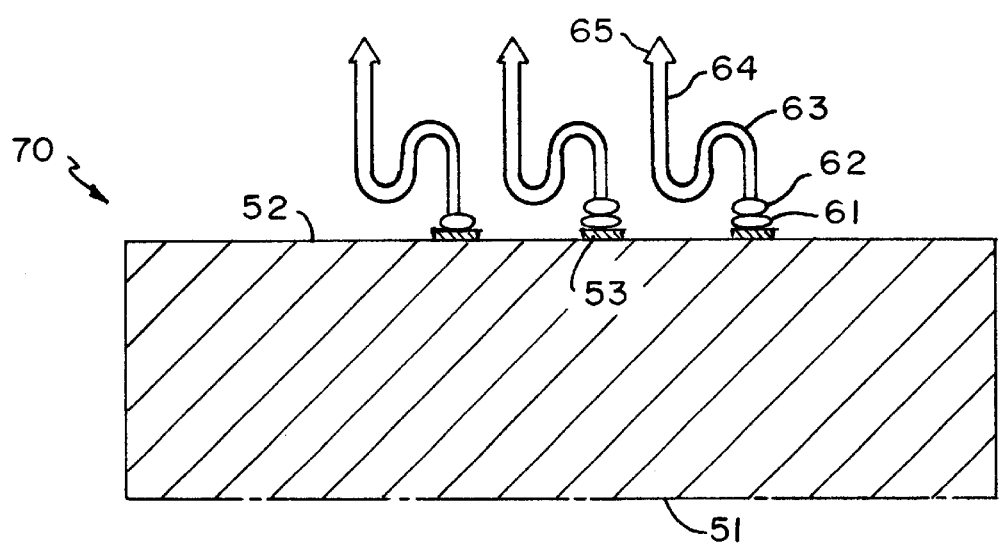
FIG. 9 shows a cross-section of an alternate embodiment of an array of probes mounted on a substrate with new tips attached to the ends of the new probe wires.

FIG. 9 shows a cross section of an alternate embodiment of an array of probes (70) mounted on a substrate (51) with new tips (65) attached to the ends (64) of the new probe wires (63). The new tips (65) are attached to the ends (64) of the new probe wires (63) with a process that ensures the height of the new tips (65) are the same as the height of the tips (57) of the original probes (50) and the spacing from wire to wire is the same for all of the curved wires (55, 63).

Figure 10:
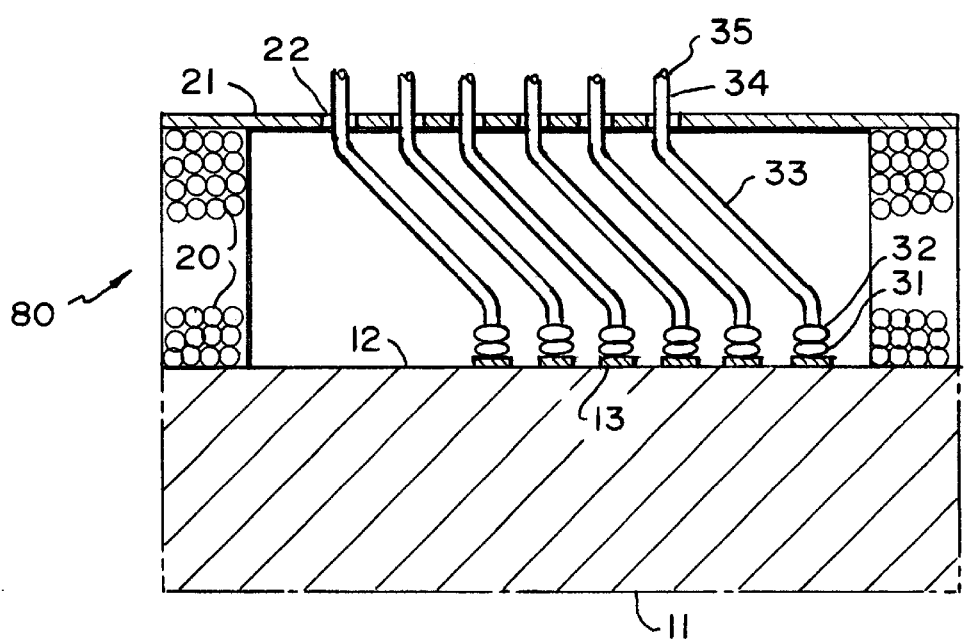
FIG. 10 shows a cross-section of an array of probes that have all been reworked.

FIG. 10 shows a cross section of an array of probes (80) that have all been reworked. While it is desireable to repair, relace, or rework only the probes that have been damaged on a test fixture, it is somtimes easier to repair all of the probes on a test susbtrate if multiple probes have been damaged. The process used to repair all of the probes on a substrate is the same as the process used to selectively replace only the damaged probes as described in the previous figures. After the wires have been removed the remaining ball bonds can be flattened by a mechanical means or polished to uniform height to prepair for the next wirebonding process.

Figure 11:
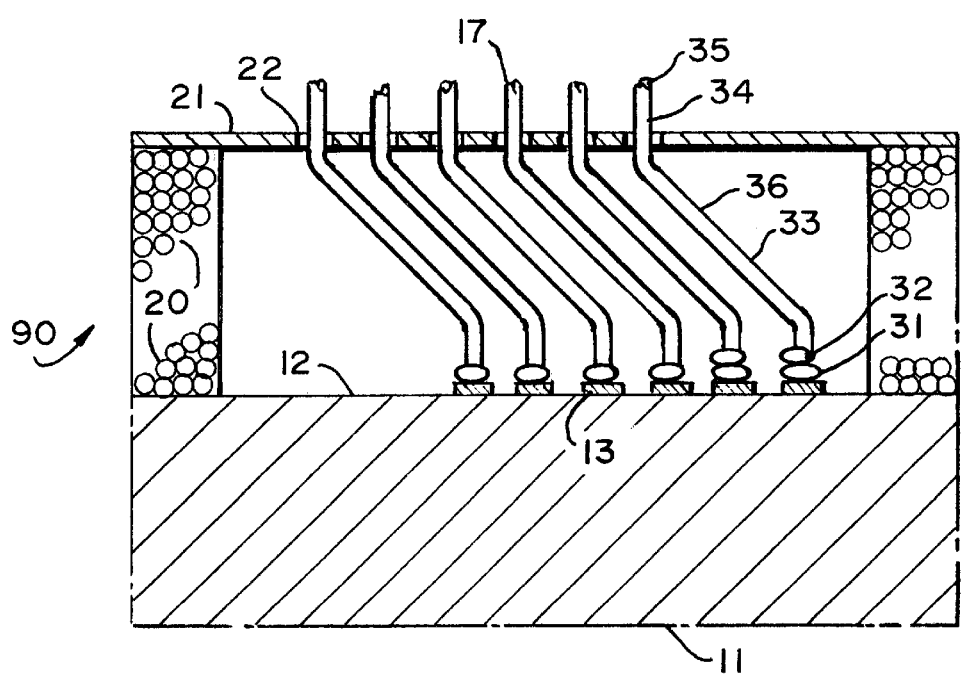
FIG. 11 shows a cross-section of an array of plated probes with a section of probes that have been reworked and replated.

FIG. 11 shows a cross section of an array of plated probes (90) with a section of probes that have been reworked and replated. FIG. 11 is similar to FIG. 5 with the addition of plating (36) on the probe wires (33). The probe wires (33) are plated (36) after removal of the damaged probe wires and new probe wires (33) are bonded to the flattened ball bonds (31). After the repaired probe wires (33) are plated (36), the surface layer alignment mask (21) and spacer (20) replaced over the ends (17, 35) of the probes.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A process for repairing a damaged flying lead wire attached to an electronic circuit component comprising the following steps:
   removing said damaged flying lead wire from a first surface of a substrate of said electronic circuit component while leaving a ball bond attached to said first surface of said substrate;
   flattening said ball bond using mechanical means to keep said ball bonds at the same height;
   attaching a new flying lead wire to said ball bond which is attached to said first surface of said substrate of said electronic circuit component.

2. A process for repairing a section containing damaged probe wires comprising the following steps:
   removing all probe wires in said section from a substrate of an electronic circuit component while keeping keeping all ball bonds in said section attached to said substrate;
   flattening the ball bonds in said section using mechanical means to keep all said bonds at the same height;
   attaching a new set of probe wires to said ball bonds which are attached to said substrate of said electronic circuit component.

3. The process according to claim 1 wherein said mechanical means is a polishing process.

4. A process according to claim 3, further including the capability to create said new flying lead wires with the same column and row spacing as the original said flying lead wires.

5. A process according to claim 4, further including the capability to create said new flying lead wires with the same wire geometry as the original said flying lead wires.

6. A process according to claim 5, further including the capability to create said new flying lead wires with the same probe height as the original said flying lead wires.

7. A process according to claim 5, further including the capability to replace, align, and attach a surface layer alignment mask to the plurality of said new flying lead wires.

8. A process according to claim 5, further including the capability to replace, align, and attach a plurality of hardened tips to the plurality of said new flying lead wires.

9. The process according to claim 2 wherein said mechanical means is a polishing process.

10. A process according to claim 9, further including the capability to create said new flying lead wires with the same column and row spacing as the original said flying lead wires.

11. A process according to claim 10, further including the capability to create said new flying lead wires with the same wire geometry as the original said flying lead wires.

12. A process according to claim 11, further including the capability to create said new flying lead wires with the same probe height as the original said flying lead wires.

13. A process according to claim 12, further including the capability to replace, align, and attach a surface layer alignment mask to the plurality of said new flying lead wires.

14. A process according to claim 12, further including the capability to replace, align, and attach a plurality of hardened tips to the plurality of said new flying lead wires.

15. A process according to claim 12, further including the capability to replace, align, and attach a plurality of hardened tips to the plurality of said new flying lead wires.

* * * * *